United States Patent [19]

Wendell

[11] Patent Number: 5,075,578
[45] Date of Patent: Dec. 24, 1991

[54] INPUT BUFFER REGENERATIVE LATCH

[75] Inventor: Dennis L. Wendell, Pleasanton, Calif.

[73] Assignee: National Semiconductor Corporation, Santa Clara, Calif.

[21] Appl. No.: 641,983

[22] Filed: Jan. 16, 1991

[51] Int. Cl.5 .................. H03K 19/092; H03K 19/094
[52] U.S. Cl. ................................... 307/475; 307/451; 307/446; 307/448
[58] Field of Search ............... 307/475, 451, 446, 448, 307/443

[56] References Cited

U.S. PATENT DOCUMENTS

| | | | |
|---|---|---|---|
| 4,622,475 | 11/1986 | Whiteley | 307/530 |
| 4,724,343 | 2/1988 | Le Roux et al. | 307/446 |
| 4,779,016 | 10/1988 | Sugiyama et al. | 307/475 |
| 4,823,028 | 4/1989 | Lloyd | 307/443 |
| 4,857,766 | 8/1989 | Pricer et al. | 307/475 |
| 4,968,905 | 11/1990 | Schwo et al. | 307/451 |
| 4,992,681 | 2/1991 | Urakawa et al. | 307/451 |
| 5,017,812 | 5/1991 | Wu | 307/475 |

Primary Examiner—Stanley D. Miller
Assistant Examiner—Scott A. Ouellette
Attorney, Agent, or Firm—Townsend and Townsend

[57] ABSTRACT

An input buffer for converting ECL signals to CMOS signals in a BiCMOS chip. The buffer has an emitter follower circuit for receiving the ECL input signal and is coupled to a static amplifier. The output of the static amplifier is forwarded to a differential amplifier which is activated by a clock signal whenever an ECL high level input is applied to the buffer circuit. The differential voltage output from the differential amplifier represents the CMOS level signal.

10 Claims, 2 Drawing Sheets

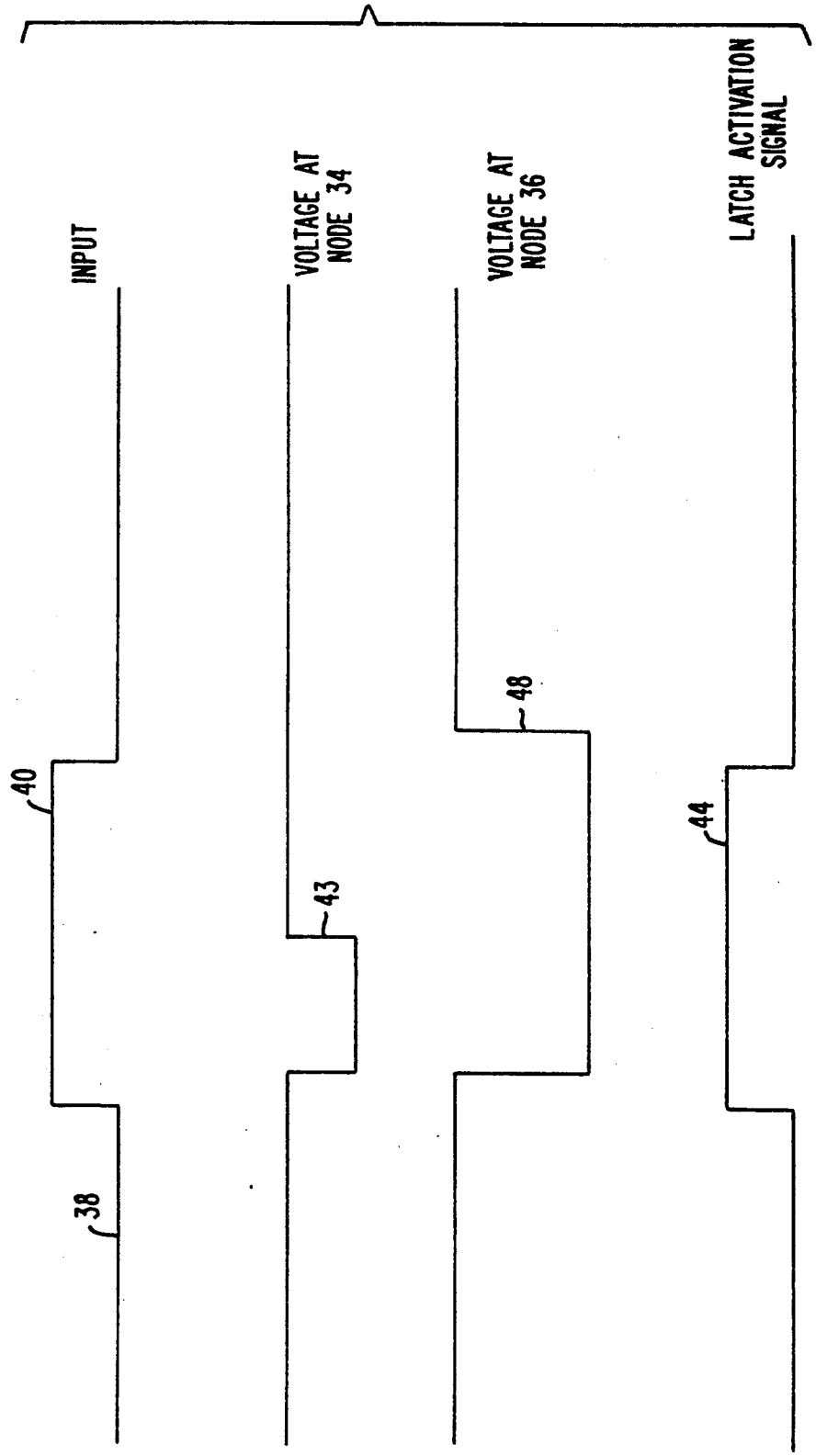

INPUT BUFFER REGENERATIVE LATCH

BACKGROUND OF THE INVENTION

The present invention is related to translator circuits useful for converting emitter coupled logic (ECL) level signals to complementary metal oxide semiconductor (CMOS) level signals.

BiCMOS integrated circuits are semiconductor devices in which bipolar technology is combined with CMOS technology. BiCMOS integrated circuits are useful for providing, on a single chip, both the desirable switching speeds of bipolar devices and the desirable area requirements of CMOS devices. The resulting BiCMOS device has a silicon area per unit current drive which is much less than a comparable CMOS circuit.

Some BiCMOS integrated circuit communicate with the outside world with signal levels appropriate for bipolar logic circuits while CMOS level signals are used within the device. A common bipolar logic used in BiCMOS devices is ECL which has a signal range from −0.9 to −1.7 volts. CMOS signals, however, swing in a 5-volt range. The ECL level input signals must therefore be buffered and translated to CMOS level signals. Another goal, then, is to bring ECL signals into the BiCMOS integrated circuit and translate these incoming signals into CMOS levels for use by the CMOS portion of the chip as quickly as possible.

SUMMARY OF THE INVENTION

The present invention provides an input buffer regenerative latch for conversion of ECL level signals to CMOS level signals. According to one embodiment of the invention, the ECL signal is input to a static amplifier via an ECL emitter follower configuration. After the static amplifier stage the signal is passed through a regenerative differential amplifier. The differential signal at the outputs of the regenerative amplifier provides the CMOS level signals.

The buffer circuit is inherently fast since the circuit essentially behaves as a current steering mechanism into a regenerative latch and transistors do not need to be fully turned on or off. The conversion of ECL level signals to CMOS level signals can thus take place in 0.5 nsec (in a leff =0.9 μm technology).

BRIEF DESCRIPTION OF THE DRAWINGS

FIG. 2 is a timing diagram illustrative of the operation of the circuit given in FIG. 1.

DESCRIPTION OF THE PREFERRED EMBODIMENT

Figure 1:
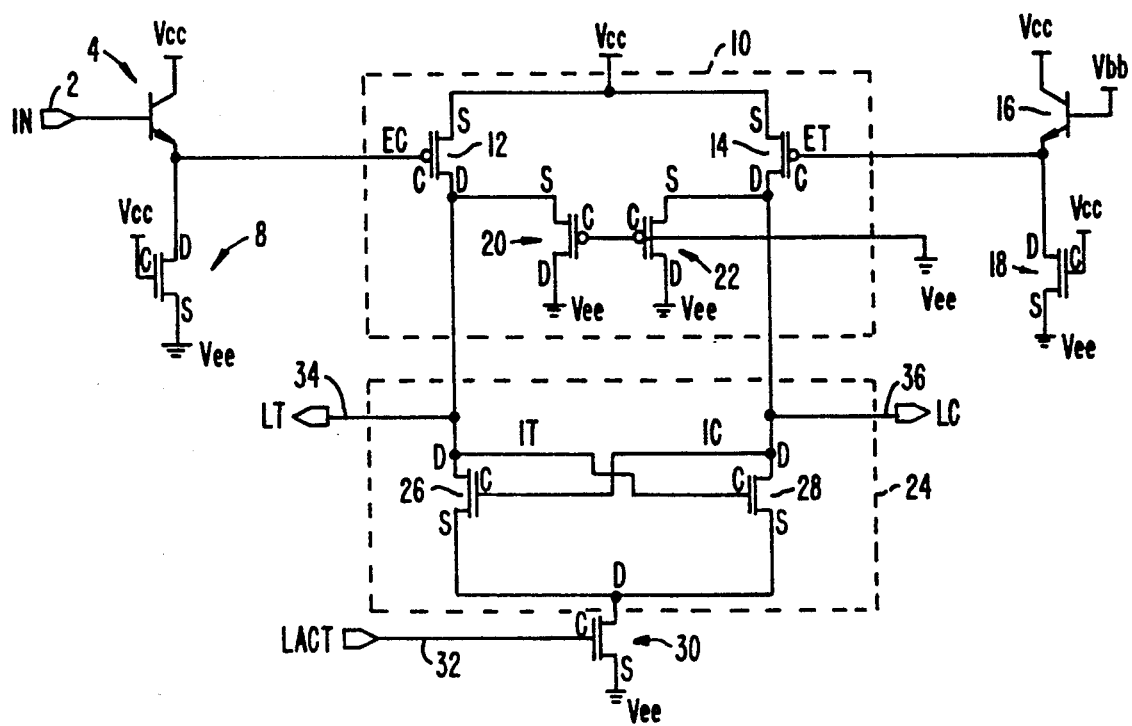
FIG. 1 is a circuit diagram of an embodiment of the present invention.

FIG. 1 is a circuit diagram of an embodiment of the present invention. The circuit has an input terminal 2 which receives ECL signals from an input pad (not shown). Input terminal 2 connects to the base of an NPN transistor 4. The collector of transistor 4 is connected to Vcc and the emitter is coupled to the drain of an NMOS transistor 8. The gate of NMOS transistor 8 is also connected to Vcc and the source of the transistor connects to Vee. Transistor 8 serves as a current source to keep transistor 4 at least partially turned on at all times.

The emitter of transistor 4 also connects to the gate of a PMOS transistor 12 which serves as one input to a static amplifier 10. The source of transistor 12 connects to the other input of amplifier 10, a PMOS transistor 14, and also to Vcc. The gate of transistor 14 connects to the emitter of a second bipolar transistor 16. The base of bipolar transistor 16, is coupled to a reference voltage Vbb of −1.32 volts relative to $V_{cc}$. The emitter of transistor 16 connects to the drain of another NMOS transistor 18. Transistor 18 is configured in similar fashion to transistor 8 and like transistor 8, transistor 18 functions as a current source to keep transistor 16 at least partially turned on at all times.

The drains of both transistors 12 and 14 are each coupled to the source of one of transistors 20 or 22 respectively. Both transistors 20 and 22 which function as current sources are PMOS transistors whose gates are tied to each other and to Vee. The drain of each of transistors 20 and 22 are also tied to Vee.

In addition to connecting to the source of transistors 20 and 22, the drain of each of transistors 12 and 14 also connect to the inputs of regenerative latch 24. Regenerative latch 24 comprises two cross coupled NMOS transistors 26 and 28. Regenerative latch 24 is activated by transistor 30 which turns on when a control signal appears at input 32 of the system. The output of latch 24 is the differential signal appearing on output leads 34 and 36.

FIG. 2 contains a timing diagram from which operation of the circuit can be explained. In the quiescent state, an ECL low level signal 38 or an ECL low level signal is present at input terminal 2. In the quiescent state, both transistors 12 and 14 sink an approximately equal amount of current through each of transistors 20 and 22. In these conditions, differential signal is applied at terminals 34 and 36 before latch activation. This condition therefore corresponds to a CMOS low level signal of 0 volts.

When ECL high signal 40 is present at input terminal 2, transistor 12 swings from approximately $3\phi_{be}$ to approximately 2 $_{be}$. This action causes a drop in the voltage 43, present at node 34 (shown in FIG. 1) of the circuit.

Shortly after the leading edge of signal 40 has passed, the clock signal LACT, 44, is applied at the gate of transistor 30 causing that transistor to become conductive and activate latch 24. With latch 24 active, the excess current gets diverted to the gate of transistor 26 which causes that transistor to become more conductive and the voltage 43 present at node 34 falls toward $V_{ee}$. The conduction of current through transistor 26 keeps transistor 28 turned off. The voltage 48 at node 36 (shown in FIG. 1) drops initially then rises to $V_{cc}$.

The differential voltage between nodes 34 and 36 can be measured on node 32 at the trailing clock edge of signal 44. This differential voltage corresponds to a value of five volts or a CMOS level high signal.

After the trailing edge of clock signal 44 which is present at node 32, transistor 30 is no longer conductive. Through the cross coupling of the latch transistors 26 and 28, the differential voltage at nodes 34 and 36 returns to approximately zero volts. The circuit thus returns to the quiescent state.

The preferred embodiment of the present invention has now been described. Variations and modifications will be readily apparent to those of skill in the art. For example, those skilled in the art will recognize that the invention may be implemented by transistors having a polarity opposite of that shown in the Figs., if voltages of opposite polarity are applied. For this reason, the invention should be construed in light of the claims.

What is claimed is:

1. An input buffer regenerative latch for converting ECL level signals to CMOS level signals comprising:
    an emitter follower circuit having a first and second input and an output;
    said first input of said emitter follower circuit coupled to an ECL signal;
    said second input of said emitter follower circuit coupled to a reference voltage;
    a static amplifier, having an output and an input connected to the output of said emitter follower circuit;
    a differential amplifier having an output, and having an input connected to the output of said static amplifier for developing a differential voltage at the output whereby said differential voltage is a CMOS level signal.

2. The input buffer of claim 1 wherein said emitter follower circuit comprises two bipolar transistors.

3. The input buffer of claim 1 wherein said static amplifier comprises:
    a first, a second, a third, and a fourth MOS transistor;
    said first MOS transistor having a gate electrode connected to said emitter follower circuit, a drain electrode connected to a source electrode of said third MOS transistor and to the input of said differential amplifier, and a source electrode connected to a source electrode of said second MOS transistor and to a second reference voltage;
    said second MOS transistor having a drain electrode connected to a source electrode of said fourth transistor and to the input of said differential amplifier, a gate electrode connected to said emitter follower circuit and to the second reference voltage;
    said third MOS transistor having a drain electrode coupled to a third reference voltage and a gate electrode connected to a gate electrode of said fourth MOS transistor and to said third reference voltage; and
    said fourth MOS transistor having a drain electrode connected to said third reference voltage.

4. The input buffer of claim 1 wherein said differential amplifier comprises a pair of cross coupled MOS transistors.

5. The input buffer of claim 1 further comprising a switch coupled to said differential amplifier for activating said differential amplifier when a control signal is asserted.

6. The input buffer of claim 1 further comprising a current source coupled to said emitter follower circuit.

7. An input buffer for converting an ECL level input to a CMOS level output comprising:
    a first bipolar transistor having a base electrode connected to said ECL level input, an emitter electrode connected to a drain electrode of a first MOS transistor and to a gate electrode of a second MOS transistor, and a collector electrode connected to a first reference voltage;
    said first MOS transistor having a gate electrode connected to said first reference voltage and a source electrode connected to a second reference voltage;
    said second MOS transistor having a source electrode connected to said first reference voltage and to a source electrode of a third MOS transistor, and a drain electrode connected to a source electrode of a fourth MOS transistor and to a first output node;
    said third MOS transistor having a gate electrode connected to an emitter electrode of a second bipolar transistor and a drain electrode connected to a source electrode of a fifth MOS transistor and to a second output node;
    said fifth MOS transistor having a gate electrode connected to gate electrode of said fourth MOS transistor and to said second reference voltage, and drain electrode connected to a drain electrode of said fourth transistor and to said second reference voltage;
    said second bipolar transistor having a collector electrode connected to said first reference voltage and a base electrode connected to a third reference voltage;
    a sixth MOS transistor having a drain electrode connected to the emitter electrode of said second bipolar transistor, a gate electrode connected to said first reference voltage, and a source electrode connected to said second reference voltage;
    a seventh MOS transistor having a drain electrode connected to said second output node and to a gate electrode of an eighth MOS transistor, a gate electrode connected to a drain electrode of said eighth MOS transistor and a source electrode connected to a drain electrode of a MOS ninth transistor;
    said eighth MOS transistor having a source electrode connected to the drain electrode of said ninth MOS transistor;
    said ninth transistor having a source electrode connected to said second reference voltage and having a gate electrode connected to a clock signal wherein said seventh MOS transistor and eighth MOS transistor are activated when said clock signal is asserted in response to a change in a level of said ECL input signal; and
    whereby said CMOS level signal appears as a differential voltage of said first and second output nodes.

8. The input buffer of claim 7 wherein said first, sixth, seventh, eighth, and ninth MOS transistors are NMOS transistors.

9. The input buffer of claim 8 wherein the second, third, fourth and fifth MOS transistors are PMOS transistors.

10. The input buffer of claim 9 wherein said first and second bipolar transistors are NPN transistors.

* * * * *